United States Patent
Abraham et al.

(10) Patent No.: US 7,419,915 B2
(45) Date of Patent: Sep. 2, 2008

(54) LASER ASSISTED CHEMICAL ETCHING METHOD FOR RELEASE MICROSCALE AND NANOSCALE DEVICES

(75) Inventors: Margaret H. Abraham, Los Angeles, CA (US); Henry Helvajian, Pasadena, CA (US); Siegfried W. Janson, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 200 days.

(21) Appl. No.: 11/061,485

(22) Filed: Feb. 17, 2005

(65) Prior Publication Data

US 2006/0183330 A1    Aug. 17, 2006

(51) Int. Cl.
*H01L 21/302* (2006.01)
(52) U.S. Cl. .................. 438/743; 438/738; 438/735; 438/705; 438/690; 257/E21.598
(58) Field of Classification Search .............. 438/690, 438/705, 735, 738, 743
See application file for complete search history.

(56) References Cited

U.S. PATENT DOCUMENTS

| 5,876,187 A * | 3/1999 | Forster et al. ............... 417/322 |
| 2003/0003619 A1 * | 1/2003 | Winer et al. .................. 438/50 |
| 2006/0115965 A1 * | 6/2006 | Abraham .................... 438/510 |

OTHER PUBLICATIONS

Bloomstein et al., "Laser-chemical three-dimensional writing for microelectromechanics and application to standard-cell microfluidics", J. Vac. Sci. Technol. B 10(6), Nov./Dec. 1992, pp. 2671-2674.*

* cited by examiner

*Primary Examiner*—Wael Fahmy
*Assistant Examiner*—Christy L Novacek
(74) *Attorney, Agent, or Firm*—Derrick Michael Reid

(57) ABSTRACT

A method using an etchant and a laser for localized precise heating enables precise etching and release of MEMS devices with improved process control while expanding the number of materials used to make MEMS, including silicon-dioxide patterned films buried in and subsequently released from bulk silicon, as a direct write method of release of patterned structures that enables removal of only that material needed to allow the device to perform to be precisely released, after which, the bulk material can be further processed for additional electrical or packaging functions.

13 Claims, 2 Drawing Sheets

LASER ASSISTED CHEMICAL ETCHING METHOD FOR RELEASE MICROSCALE AND NANOSCALE DEVICES

REFERENCE TO RELATED APPLICATION

The present application is related to applicant's application entitled Ion Implanted Microscale and Nanoscale Device Method, Ser. No. 10/999,633, filed Nov. 30, 2004, now abandoned, but continued into application Ser. No. 11/504,466, filed Aug. 15, 2006, having a common inventor.

FIELD OF THE INVENTION

The invention relates to the field of methods of forming microelectromechanical systems, semiconductor devices and optical devices. More particularly, the present invention relates to ion implantation and laser assisted chemical etching of microscale and nanoscale devices.

BACKGROUND OF THE INVENTION

The global market for MEMS devices and nanotechnology is well established and currently is over eight billion dollars per year. Currently most microeletromechanical systems (MEMS) are constructed using modified versions of VLSI technology wherein layers of silicon nitride, silicon dioxide, and polysilicon are successively grown and patterned using photolithography. This process is inherently costly and time consuming, as there are typically as many as seven growth and lithography steps. The process is also limited by the resolution of the lithography and wet or dry etch processes to the extent that nanoscale devices are not easily achievable.

Continuous oxide films have been implanted into silicon using a SIMOX process. An O+ ion broad area beam is used for creating an unpatterned buried film under the surface of and into bulk silicon. The thickness of the buried film is determined by the concentration dose of the ion broad area beam. The bulk silicon with the buried oxygen film is then annealed to create a silicon dioxide $SiO_2$ buried film in bulk silicon. Such buried films would normally be destroyed by conventional etching processes and are unsuitable for creating nanoscale devices, that is, ion broad area beams would not be used for creating nanoscale devices because there would be no suitable etching process for releasing the nanoscale $SiO_2$ MEMS. The standard application is to create an electrical barrier in VLSI bulk silicon.

Typically, silicon MEMS devices are fabricated where a silicon dioxide $SiO_2$ film is used as a sacrificial layer. Deposited or thermally grown films are used for creating layers that are patterned by photolithography and then etched away. The resolution of this process is unsuitable for making nanoscale features. Typically, MEMS devices are then released using a wet or vapor phase hydrofluoric acid to dissolve the silicon dioxide across the whole wafer at all levels. In practical terms, the wet or vapor process is limited to making polysilicon devices, as there is currently no simple means for doing the opposite. That is, there is no good method of cleanly removing the silicon while selectively leaving the silicon dioxide to form a three-dimensional structure. Therefore, the device material is restricted to polysilicon even when silicon dioxide is integral to the process. MEMS devices are typically created using conventional photolithography processes having multiple steps with limited resolution, and hence unsuitable for manufacturing of nanoscale devices.

Laser assisted chemical etching using chlorine gas has been used to etch bulk silicon. Silicon dioxide structures have been defined using standard lithographic techniques and VLSI processing. Commonly used wet etches, like EDTA or KOH, can remove silicon but are difficult to handle and the etch selectivity is highly temperature dependent. Further, wet etching of removed silicon dioxide creates stiction in the MEMS device as the surface tension of the drying liquid draws the small devices down onto the substrate. Xenon difluoride and bromine trifluoride in the vapor phase have been used to selectively remove silicon and leave silicon dioxide or nitride but the process can be very aggressive and hard to isolate and control. These release processes disadvantageously limit the ability to use the rest of the wafer for other electrical or packaging purposes and make these processes poor candidates for production environments. In the case of integrating electronics and packaging, industry is searching for improved methods, such as an electronics first method that deposits the electronics first and then uses the MEMS process to create further structures, or such as, a MEMS first method that conversely creates the MEMS first and is followed with the deposition of electronics and packaging. Neither the electronics first or the MEMS first methods are particularly suitable for high yield processes. These and other disadvantages are solved or mitigated using the invention.

SUMMARY OF THE INVENTION

An object of the invention is to provide a method for forming a patterned buried layer.

Another object of the invention is to provide a method for forming a patterned buried layer of silicon dioxide in bulk silicon.

Another object of the invention is to provide a method for forming a patterned buried layer of silicon carbide in bulk silicon.

Another object of the invention is to provide a method for forming a patterned buried layer of silicon nitride in bulk silicon.

Another object of the invention is to provide a method for forming a patterned buried layer of metal silicides in bulk silicon.

Yet another object of the invention is to provide a method for chemical etching about a patterned buried layer.

Still another object of the invention is to provide a method for chemical etching about a patterned buried layer of silicon dioxide in bulk silicon.

A further object of the invention is to provide a method for laser-assisted chemical etching about a patterned buried layer of silicon dioxide in bulk silicon.

Yet a further object of the invention is to provide a method for laser-assisted chemical etching about a patterned buried layer of silicon dioxide in bulk silicon for creating microscale and nanoscale devices.

Yet a further object of the invention is to provide a method for laser-assisted chemical etching about a patterned buried layer in bulk silicon with laser-assisted chemical vapor deposition of a metal for creating microscale and nanoscale devices.

The invention in a first aspect creates buried patterned films in a bulk material, such as a silicon dioxide patterned film in bulk silicon, using a focused ion beam or a broad area ion beam and a mask. The invention in a second aspect uses laser-assisted chemical etching for etching bulk silicon away from a patterned buried film. The etching is with such precision that microscale and nanoscale devices, such as microelectromechanical systems (MEMS) and nanoelectromechanical systems (NEMS), can be fabricated. In the preferred form, a laser is used to precisely heat an area about a buried film so that the localized heat enhances the chemical etching of the substrate for releasing nanoscale patterned structures that exist in or on the silicon wafer.

The method is preferably for making MEMS/NEMS type structures using patterned implants. In this instance, the device is defined by the implantation of ion species, for example to create imbedded stoichiometric SiO2 film, or by the disordering of the Si material. The buried film is formed either using standard lithography to mask the implant from certain regions, or using a direct write focused ion beam. Further control of the release of the structure is achieved using laser direct write chemical etching, reactive ion etching, or wet etching.

Using the method, devices can be fabricated with microscale or nanoscale dimensions using implanted ions. The resolution of the device is defined by the ion beam implant pattern resolution and dose. The resulting thicknesses are on the order of thousands of Angstroms and may be patterned using lithography or by direct write with a focused ion beam. Hence, these imbedded structures are inexpensive to prototype using direct write focused ion beams. The process can be scaled up for mass production by using two or three mask layers and broad ion implantation. The method does not require the growth of layers of various oxides and nitrides on a substrate, a process that has traditionally introduced run-to-run variation in the VLSI process.

The method is preferably used for releasing silicon dioxide three-dimensional MEMS/NEMS type structures using laser assisted chemical etching. A laser light with a wavelength impinging on the surface of the wafer that is transparent to the device being released, that is, patterned silicon dioxide, but absorbed in the substrate, such as silicon, is used. The laser heats the surface below or above to enhance the chemical etch of the silicon. The control of the release of the silicon dioxide structure using laser direct write chemical etching is improved and provides for isotropic etching. Additionally, certain parts of the bulk silicon may be left intact, or reserved, to form packages or patterned with microelectronics, as part of the device. Further, by selecting various laser wavelengths and chemistries, the method can be utilized to release other materials, implanted or otherwise, that are currently not part of standard MEMS processes.

The method can be extended to materials used to make MEMS, to insulators, and conductors. The method enables the release of devices on the nanometer scale without causing additional stresses or stiction which would normally damage these small structures. Further, the ability to integrate the MEMS devices with standard on-chip microelectronics, created before the release, is a direct result of the direct write process. The methods allows for post packaging release of the MEMS device, which can lead to high yields of working devices. These and other advantages will become more apparent from the following detailed description of the preferred embodiment.

DETAILED DESCRIPTION OF THE PREFERRED EMBODIMENT

Figure 1:
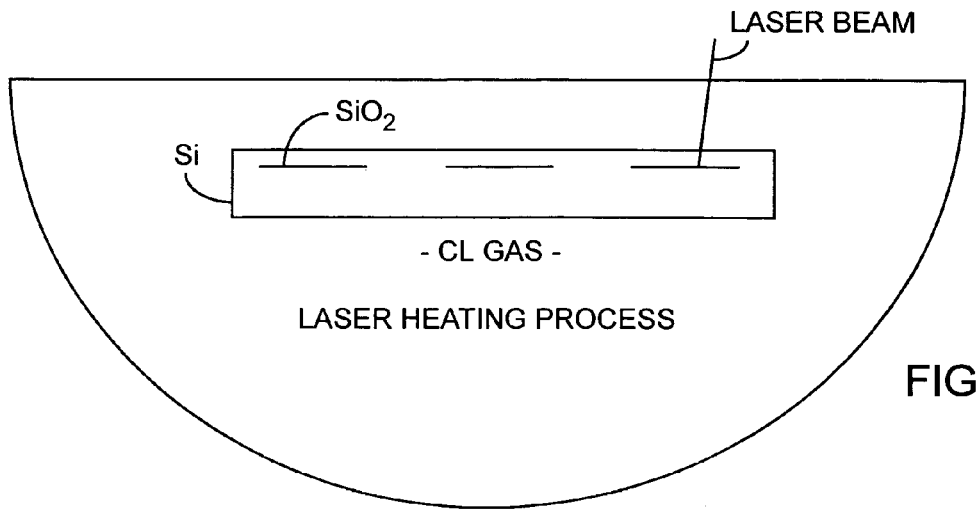
FIG. 1 is a drawing showing a laser heating process.
Figure 2:
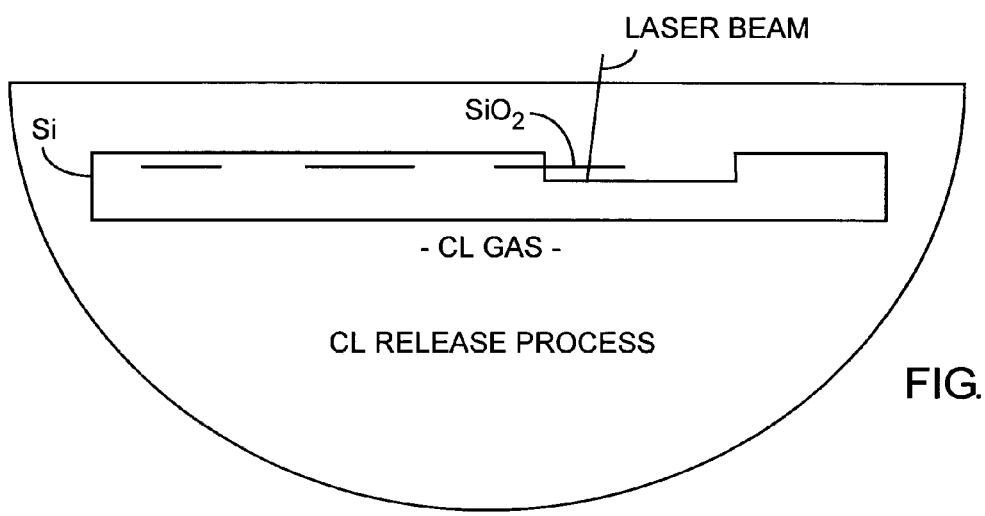
FIG. 2 is a drawing showing a chlorine etch release process.
Figure 3:
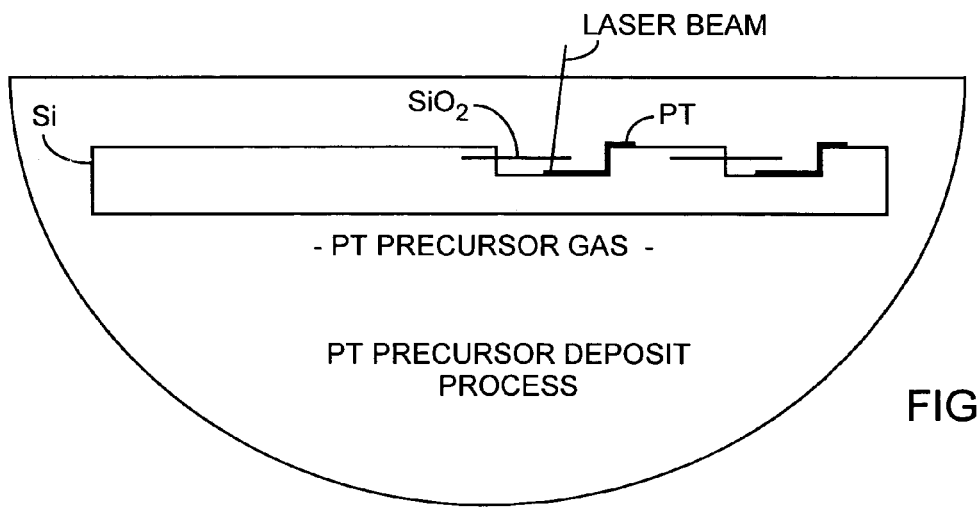
FIG. 3 is a drawing showing a precursor deposit process.

An embodiment of the invention is described with reference to the figures using reference designations as shown in the figures. Referring to FIG. 1, buried patterned films can be released from bulk silicon. A buried patterned film of silicon dioxide ($SiO_2$) is implanted in bulk silicon. The pattern buried film can be created using convention photomasks disposed on the bulk silicon or by an O+ focused ion beam. Laser assisted chemical etching about the buried film starts with first applying a focused laser beam to a volume to be heated about the buried film. Referring to FIG. 2, a laser beam is used to locally heat volumes of bulk silicon about the buried patterned film, and when exposed to an etchant, such as chlorine gas ($Cl_2$), the bulk silicon is etched away forming a cavity about the patterned buried film, and released to expose the buried film and cavity for further processing. Referring to FIG. 3, a laser beam is used to chemically deposit a metal film, such as a platinum (PT) layer over the bulk silicon or in a cavity In the preferred form, the laser beam can pass through the silicon dioxide buried film in order to deposit Pt in the cavity and below exposed portions of the buried film. As such, the method is used to create a patterned buried film that can then be released with the deposit of metal films about the patterned released film.

Figure 4:
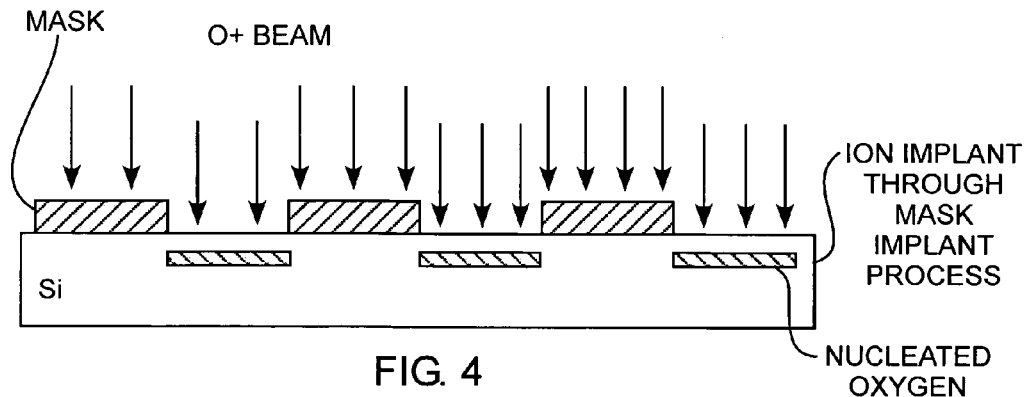
FIG. 4 is a drawing showing an ion implant masked process.
Figure 5:
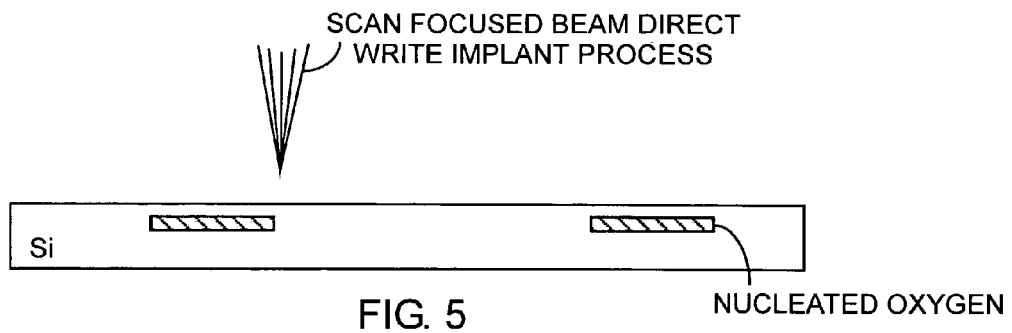
FIG. 5 is a drawing showing a scan focused beam direct write implant process.
Figure 6:
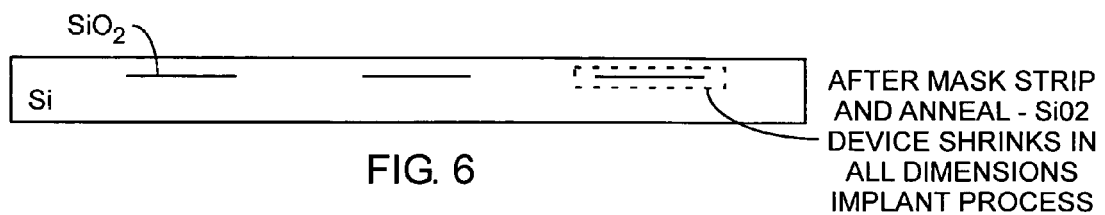
FIG. 6 is a drawing showing a strip and anneal process.
Figure 7:
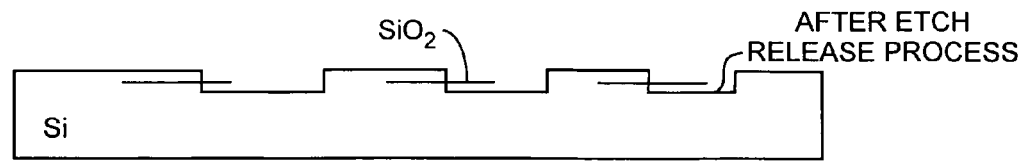
FIG. 7 is a drawing showing an after etch release process.

Referring to FIG. 4, a mask is deposited or placed over bulk silicon. The masks provide apertures through which an O+ focused ion beam penetrates for depositing O+ ions within a predetermined buried volume. The O+ ions then combine with the bulk silicon to form the buried patterned layer of $SiO_2$. Referring to FIG. 5, a scanning focused beam provides energy for localized nucleation of oxygen in the buried films. Referring to FIG. 6, the bulk material is annealed to form an etchable volume. Referring to FIG. 7, a chemical etch can be used to etch the etchable volumes. Surviving anneal buried patterns of SiO2 remain.

The method is a process that utilizes the transmission of the laser light through the layer being released to heat the surface below. This enables the light to enhance the etching of the layer beneath in a fashion that is controlled in all axes and does not cause stiction or damage to the device. The chlorine etch is nonreactive with silicon at room temperatures but readily reacts with a surface that has been laser heated. Therefore, the bulk silicon material removed is the heated silicon leaving behind the patterned silicon dioxide and unheated areas of the silicon.

The method can be applied to MEMS/NEMS by showing that the silicon dioxide transmits the laser light and removes silicon from beneath the oxide MEMS device. By simultaneously manipulating the chemistry of various vapor phase etches and the laser wavelength, a device can be released from a silicon wafer. This release process relies on the device being transparent, such as $SiO_2$, to the laser and non-reactive to the gas while the surrounding area is absorptive and readily etches in the gas at elevated temperatures. As such, voids can be written in the silicon wafer around the device, or buried patterned layer. Additionally, the method can remove silicon or polysilicon that is buried under the transparent layers, such as $SiO_2$ patterned buried layers. The depth of the material removed depends on the laser power and number of laser passes, so that the process is controllable in three dimensions. By adjusting the laser wavelength to a wavelength that is transmitted by the device material, and the chemistry to an appropriate etch for the release material, the method can be applied to MEMS/NEMS materials. The scale of the device released is unaffected by the release process so that nanoscale and microscale devices and can be fabricated and released. The same method of using laser light transmitted through the patterned film can be used to deposit a metal film in the cavity.

Implant structures can be defined using a focused beam to direct write the embedded oxide or by standard lithographic techniques using thick patterned masks to define areas open to a broad beam implant. The implant depth and thickness is defined by the beam energy and dose respectively. The implant is then annealed to form stoichiometric films imbedded in the wafer. If the implant is not annealed, then the silicon above the imbedded structure is disordered. By manipulating the chemistry of various etches, including but not limited to laser assisted direct write etches, new amorphous alloy or crystalline species can be released from the bulk wafer or open voids in the wafer in the case of disordered areas. This is accomplished by utilizing the different etch rates associated with different materials and different stoichiometries. Multiple imbedded layers can be constructed by varying the implant energy to create complex three-dimensional structures.

This invention in a first aspect is directed to the creation of buried pattern films using an ion beam, and in a second aspect is directed to laser assisted chemical etching to precisely etch around a buried pattern film, having application to MEMS and semiconductor fabrication processes. A method is suitable to mass production of MEMS/NEMS and semiconductor devices. Three-dimensional structures composed of new materials can be made allowing for new chemical species that cannot easily be grown or deposited. Due to precise laser assisted chemical etching, the method can be used to fabricate microscale and nanoscale devices limited by the size of the implanted regions. The method can extend the materials used to make MEMS, to insulators and to conductors, while maintaining the ability to integrate MEMS devices with standard on-chip microelectronics. The type of bulk substrate used may be expanded to other materials. The method can also be applied to experimentation with materials that have better tribological properties and different electrical and mechanical properties. The process can be performed after packaging to enhance yields and reliability. Further, the method can be used to trim silicon masses in resonators and oscillators to provide fine-tuning of parameters such as the operating frequency. Different materials can be selected for differing devices. Those skilled in the art can make enhancements, improvements, and modifications to the invention, and these enhancements, improvements, and modifications may nonetheless fall within the spirit and scope of the following claims.

The invention claimed is:

1. A method of releasing a patterned film, the method comprising the steps of,
   generating an ion beam of ions for generating a patterned film in a bulk material,
   focusing the ion beam toward a buried volume in the bulk material,
   annealing the bulk material for forming the patterned film, the patterned film being a chemical compound of the ions and the bulk material, and
   laser etching the bulk material about the patterned film to release the patterned film about the bulk material in the presence of a chemical etchant, the laser etching serving to heat the bulk material about the patterned film to a temperature at which the chemical etchant reacts with the bulk material for etching the bulk material for creating a cavity about the patterned film, the patterned film being a buried patterned film.

2. The method of claim 1 wherein,
   the etchant is chlorine,
   the bulk material is silicon, and
   the patterned film is a silicon dioxide patterned film.

3. The method of claim 1 wherein,
   the etchant is chlorine,
   the bulk material is silicon, and
   the patterned film is a silicon carbide patterned film.

4. A method of releasing a buried patterned film, the method comprising the steps of,
   generating an ion beam of ions,
   directing the ion beam toward a buried volume in the bulk material,
   annealing the bulk material for forming the buried patterned film, the buried patterned film being a compound of the ions and the bulk material,
   laser etching the bulk material about the buried patterned film to release the buried patterned film about the bulk material in the presence of a chemical etchant, the laser etching serving to heat the bulk material about the buried patterned film to a temperature at which the chemical etchant reacts with the bulk material for etching the bulk material for creating a cavity about the patterned film.

5. The method of claim 4 wherein,
   the ions are O+ ions,
   the bulk material is bulk silicon,
   the pattern buried layer is silicon dioxide, and
   the chemical etchant is chlorine.

6. The method of claim 4 wherein,
   the ions are C+ ions,
   the bulk material is bulk silicon,
   the pattern buried layer is silicon carbide, and
   the chemical etchant is chlorine.

7. The method of claim 4 wherein,
   the ions are metal ions,
   the bulk material is bulk silicon,
   the pattern buried layer is metal silicide, and
   the chemical etchant is chlorine.

8. The method of claim 4 wherein,
   the ions are nitrogen ions,
   the bulk material is bulk silicon,
   the pattern buried layer is silicon nitride, and
   the chemical etchant is chlorine.

9. The method of claim 4 further comprising the steps of,
   depositing a film onto the cavity using laser assisted deposition.

10. The method of claim 4 further comprising the steps of,
    depositing a precursor film of platinum onto the cavity using laser assisted deposition.

11. The method of claim 4 further comprising the steps of,
    creating a mask prior to ion implantation of the ions passing through apertures in the mask.

12. The method of claim 4 further comprising the steps of,
    creating a mask prior to ion implantation of the ions passing through apertures in the mask, the ion beam being a broad area beam, and
    removing the mask.

13. The method of claim 4 wherein,
    the ion beam is a focused ion beam.

* * * * *